(12) United States Patent
Ohno

(10) Patent No.: US 8,366,454 B2
(45) Date of Patent: Feb. 5, 2013

(54) SOCKET FOR ELECTRICAL COMPONENT

(75) Inventor: Hirohisa Ohno, Saitama (JP)

(73) Assignee: Enplas Corporation, Saitama (JP)

( * ) Notice: Subject to any disclaimer, the term of this patent is extended or adjusted under 35 U.S.C. 154(b) by 103 days.

(21) Appl. No.: 12/975,856

(22) Filed: Dec. 22, 2010

(65) Prior Publication Data

US 2011/0159714 A1    Jun. 30, 2011

(30) Foreign Application Priority Data

Dec. 25, 2009  (JP) ................................. 2009-295258

(51) Int. Cl.
*H01R 12/00* (2006.01)
*H05K 1/00* (2006.01)

(52) U.S. Cl. .......................................... 439/73; 439/331
(58) Field of Classification Search .................. 439/152, 439/73, 331, 266
See application file for complete search history.

(56) References Cited

U.S. PATENT DOCUMENTS

| | | | | |
|---|---|---|---|---|
| 4,799,897 A | * | 1/1989 | Mogi et al. ..................... | 439/264 |
| 4,846,703 A | * | 7/1989 | Matsuoka et al. .............. | 439/71 |
| 6,354,856 B1 | * | 3/2002 | Shimada ........................ | 439/266 |
| 6,447,318 B1 | * | 9/2002 | Okamoto ....................... | 439/266 |
| 6,679,715 B2 | * | 1/2004 | Okamoto ....................... | 439/266 |
| 7,775,821 B2 | * | 8/2010 | Hsu et al. ....................... | 439/266 |
| 7,976,325 B2 | * | 7/2011 | Hsiao et al. .................... | 439/266 |
| 2006/0040540 A1 | * | 2/2006 | Hayakawa ..................... | 439/266 |
| 2008/0009168 A1 | * | 1/2008 | Miyaaki et al. ............... | 439/331 |
| 2010/0041254 A1 | * | 2/2010 | Hsu et al. ....................... | 439/73 |

FOREIGN PATENT DOCUMENTS

| EP | 1605559 | | 12/2005 |
|---|---|---|---|
| JP | 2008-041434 A | | 2/2008 |
| JP | 2011134678 A | * | 7/2011 |

OTHER PUBLICATIONS

Extended European Search Report dated Apr. 8, 2011.

* cited by examiner

*Primary Examiner* — Hae Moon Hyeon
(74) *Attorney, Agent, or Firm* — Kubotera & Associates, LLC

(57) ABSTRACT

In an electrical component socket, an electrical component can be removed easily even if a fixed contact potion bites into an electrical component terminal. In the electrical component socket (11), a floating plate (14) to accommodate an IC package (12) is provided in a socket body to be able to move up and down, and is biased upward by a biasing member. In a movable contact piece (15b) of a contact pin (15), a pressing projecting piece (15m) is formed. In the floating plate (14), a pressed part (14m) to be pressed by the pressing projecting piece (15m) is formed. When the movable contact piece (15b) is elastically deformed in an opening direction and a movable contact part (15g) separates from an IC lead (12b), the floating plate (14) rises upward by the biasing member, and the IC lead (12b) separates from a fixed contact part (15d).

4 Claims, 15 Drawing Sheets

SOCKET FOR ELECTRICAL COMPONENT

CROSS REFERENCE TO RELATED APPLICATIONS

The disclosure of Japanese Patent Application No. 2009-295258, filed on Dec. 25, 2009, including the specification, drawings and abstract, is incorporated herein by reference in its entirety.

TECHNICAL FIELD

The present invention relates to an electrical component socket for removably holding an electrical component such as a semiconductor apparatus (hereinafter intergrated circuit (IC) package). More particularly, the present invention relates to an electrical component socket with improved removability of an electrical component.

BACKGROUND ART

An IC socket to removably hold an IC package, which is an "electrical component," has been known heretofore as an electrical component socket of this kind (see Patent Literature 1).

The IC package is commonly referred to as a gull-wing type, in which a plurality of IC leads to serve as "terminals" stick out sideways from two opposing sides of a package body having a substantially rectangular parallelepiped shape.

Meanwhile, as for the IC socket, an accommodating part for accommodating the IC package is formed in the socket body. Furthermore, in the IC socket, a plurality of contact pins that contact the IC leads of the IC package are provided. Each contact pin has a movable contact piece and a fixed contact piece. In the movable contact piece, a movable contact part that contacts and separates from an upper surface of an IC lead is formed. Likewise, in the fixed contact piece, furthermore, a fixed contact part that contacts and separates from the lower surface of an IC lead is formed.

In the socket body, an operating member is provided such that operating member can move up and down. By moving the operating member downward against the bias of the movable contact piece of a contact pin, in a cam part of the operating member, the operating piece of the movable contact piece of the contact pin is pushed outward.

By this means, the spring part of the movable contact piece of the contact pin deforms elastically, and, consequently, the movable contact part is separated from the IC lead, and the operating member rises upward. As a result, by the elasticity of the spring part, the movable contact part returns and contacts the upper surface of the IC lead, so that the IC lead is sandwiched between the movable contact part and the fixed contact part, and the contact pin and the IC lead are electrically connected.

CITATION LIST

Patent Literature

Japanese Patent Application Laid-Open No. 2008-41434

SUMMARY OF INVENTION

Technical Problem

In recent years, the pitch between IC leads and the width of an IC lead itself have become narrower, and, as a result, a fixed contact part to contact the IC lead has also become very thin. Consequently, if, on the basis of the prior art, a fixed contact part extends upward and downward so that its upper end portion contacts the lower surface of an IC lead, there is a threat that the upper end portion bites into the lower surface of the IC lead. Then, when the IC package needs to be removed after an IC package test and so on, there is a problem that the biting makes the removal difficult.

It is therefore an object of the present invention to provide an electrical component socket whereby an electrical component can be removed easily even when a fixed contact part bites into an electrical component terminal.

Solution to Problem

A socket for an electrical component according to the present invention comprises a socket body, in which an electrical component having a terminal extending sideways is accommodated, and a contact pin attached to the socket body, in the contact pin, a movable contact piece that is elastically deformed being formed, a movable contact part that contacts and separates from an upper surface of a terminal of the electrical component being formed in an upper end portion of the movable contact piece, and a fixed contact piece that forms a pair with the movable contact piece being formed, and in the fixed contact piece, a fixed contact part that contacts a lower surface of the terminal of the electrical component being formed, and, in the electrical component socket: in the socket body, a floating plate in which the electrical component is accommodated is provided to be able to move upward and downward and is biased upward by a biasing member; in the movable contact piece, a pressing part is formed; in the floating plate, a pressed part that is pressed by the pressing part is formed; when the movable contact piece is elastically deformed in an opening direction and the movable contact part separates from the terminal of the electrical terminal, the floating plate rises upward by means of the biasing member and the terminal of the electrical component separates from the fixed contact part; and when the movable contact piece is displaced in a closing direction by means of elasticity, the pressing part is pressed against the pressed part, so that the floating plate goes down against bias of the biasing member, the movable contact part contacts the upper surface of the terminal of the electrical component, and the fixed contact part contacts a lower surface of the terminal of the electrical component.

Advantageous Effects of Invention

With the present invention, even when an electrical component is accommodated and a fixed contact part bites into a terminal of the electrical component, upon removing the electrical component, the electrical component is lifted up by means of a floating plate, so that it is possible to separate the electrical component terminal and the fixed contact part and remove the electrical component easily. Furthermore, when a movable contact piece is displaced in a closing direction by means of elasticity, a pressing part of a movable contact piece is pressed against a pressed part of the floating plate, so that the floating plate goes down against the bias of a biasing member the movable contact part contacts the upper surface of the electrical component terminal. By this means, the closing speed of the movable contact piece is reduced when the pressing part contacts the pressed part, and, given that the movable contact part later contacts the upper surface of the electrical component terminal, it is possible to provide an effect commonly referred to as "damping effect," and cushion the impact of the contact.

DESCRIPTION OF EMBODIMENTS

Figure 1:
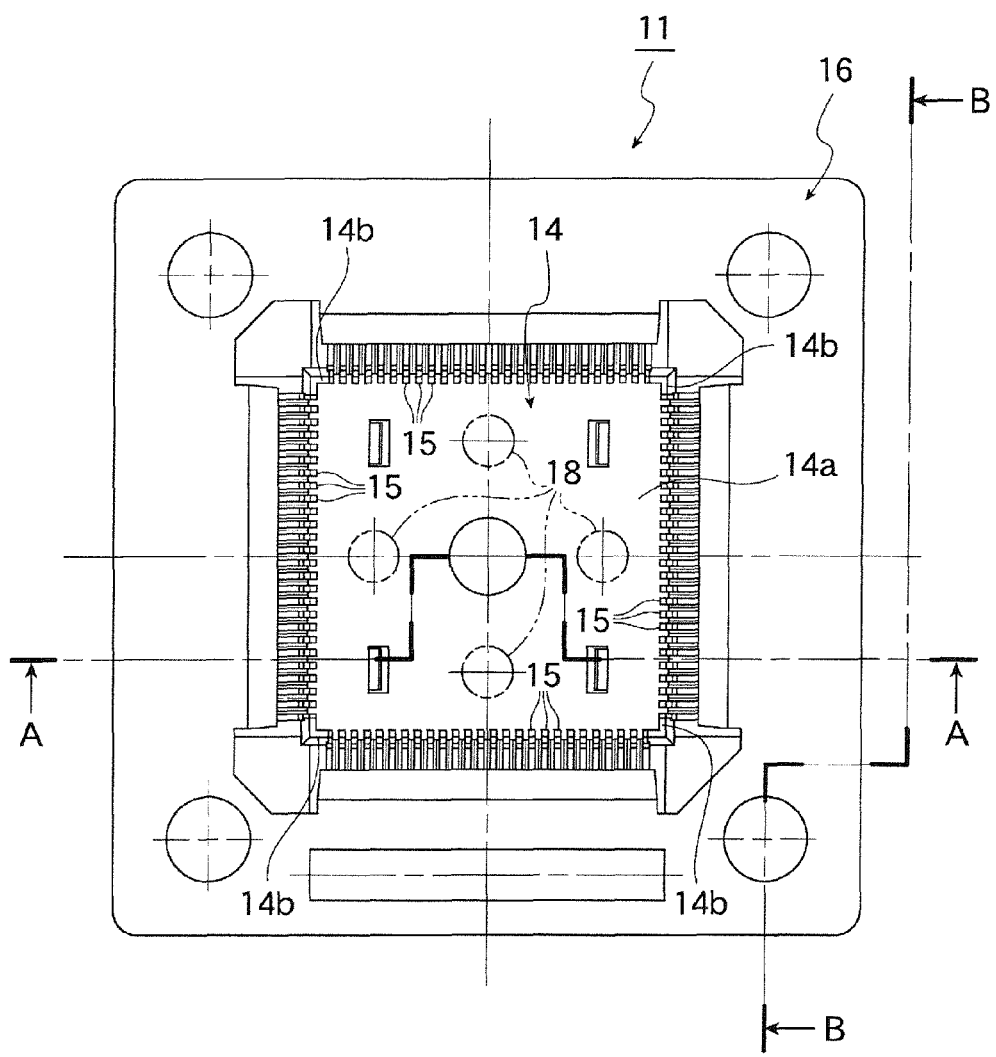
FIG. 1 is a plan view showing an IC socket according to embodiment 1 of the present invention.

Preferred embodiments of the present invention will be described below.

(Embodiment 1)

FIG. 1 to FIG. 10 show an IC socket and IC package according to embodiment 1 of the present invention.

First, the configuration of an IC socket according to the present invention will be described. To conduct a performance test of IC package 12 (which is an "electrical component"), IC socket 11 (which serves as an "electrical component socket") electrically connects IC lead 12b (which serves as a "terminal" of the IC package 12) and a wiring board (not shown) of a measurement instrument (tester).

Figure 10:
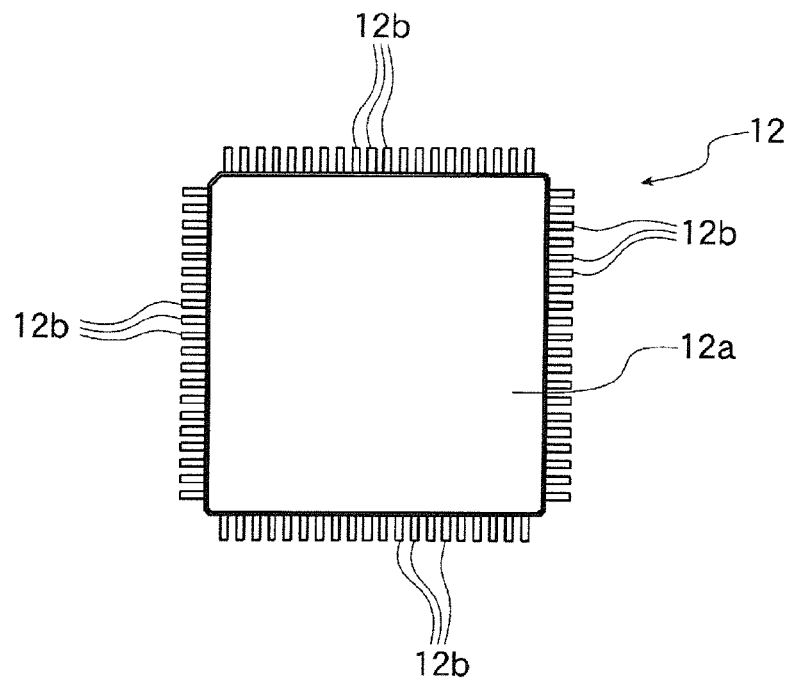
FIG. 10 shows an IC package, where (a) is a plan view and (b) is a front view of an IC package.
Figure 10:
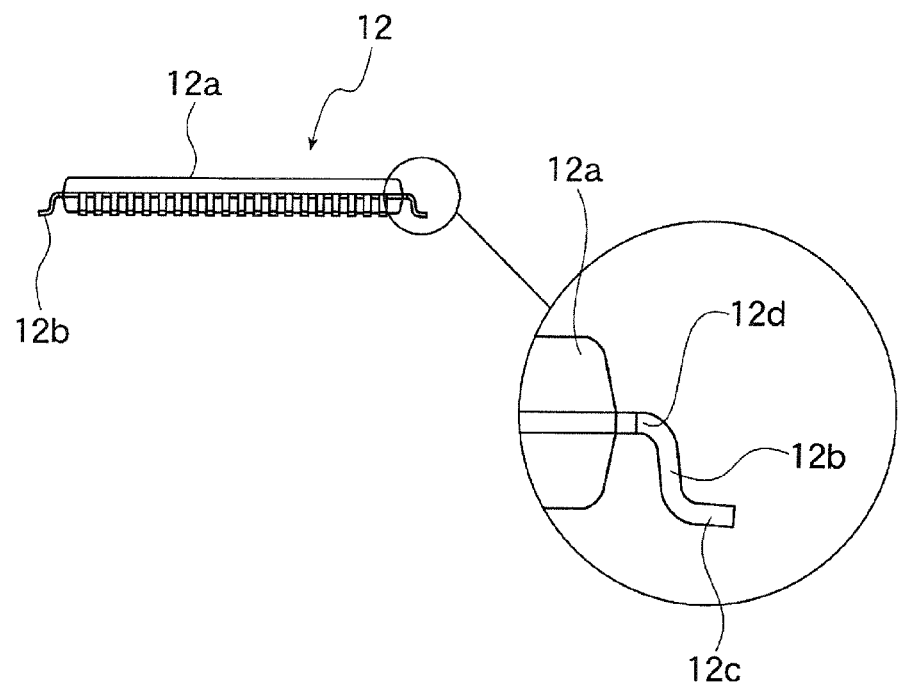

As shown in FIG. 10, the IC package 12 is commonly referred to as a gull wing type, in which many IC leads 12b stick out sideways from the peripheral four sides of package 12a of a square shape (which serves as an "electrical component body"). The IC leads 12b are formed in the shape of a crank, and shoulder part 12d, formed a step higher than the upper end portion 12c side, is formed near package body 12a.

IC socket 11 has socket body 13 installed on the wiring board. In the socket body 13, floating plate 14, in which IC package 12 is accommodated, is provided to be able to move up and down, and coil springs 18, which serve as "biasing member," are provided (in four places in FIG. 1).

Figure 4:
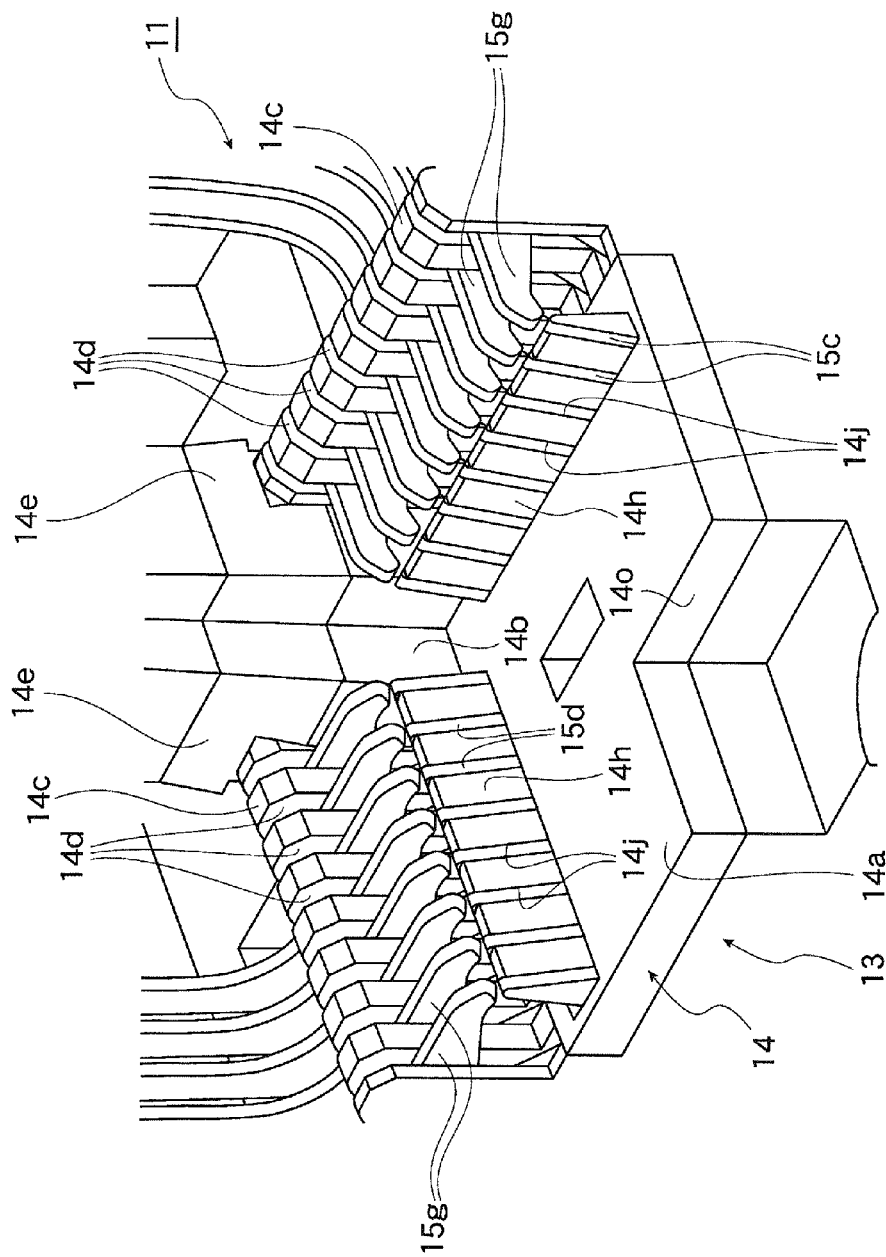
FIG. 4 is a perspective view showing an accommodating part in an IC socket and others, according to embodiment 1.

In the floating plate 14, accommodating part 14a to accommodate IC package 12 is formed, and guide part 14b to place IC package 12 in a predetermined position is provided in each corner of package body 12a. Furthermore, as shown in FIG. 4, by sidewalls 14e of each guide part 14b, IC leads 12b at far ends (not shown) are positioned, so that the whole of IC package 12 is positioned.

Furthermore, between guide parts 14b, partition parts 14c are formed in the four opposing sides surrounding accommodating part 14a. Many slits 14d are formed at predetermined intervals in these partition parts 14c. Furthermore, in the floating plate 14, limbs 14h are formed in four sides, in positions on the inner of partition parts 14c and outer of package body 12a.

The limbs 14h are each formed to be located below shoulder part 12d of each IC lead 12b of a crank shape. These limbs 14h are formed to stick out in a hill-like shape, and many slits 14j that penetrate up and down are formed at predetermined intervals (see FIG. 3).

Figure 2:
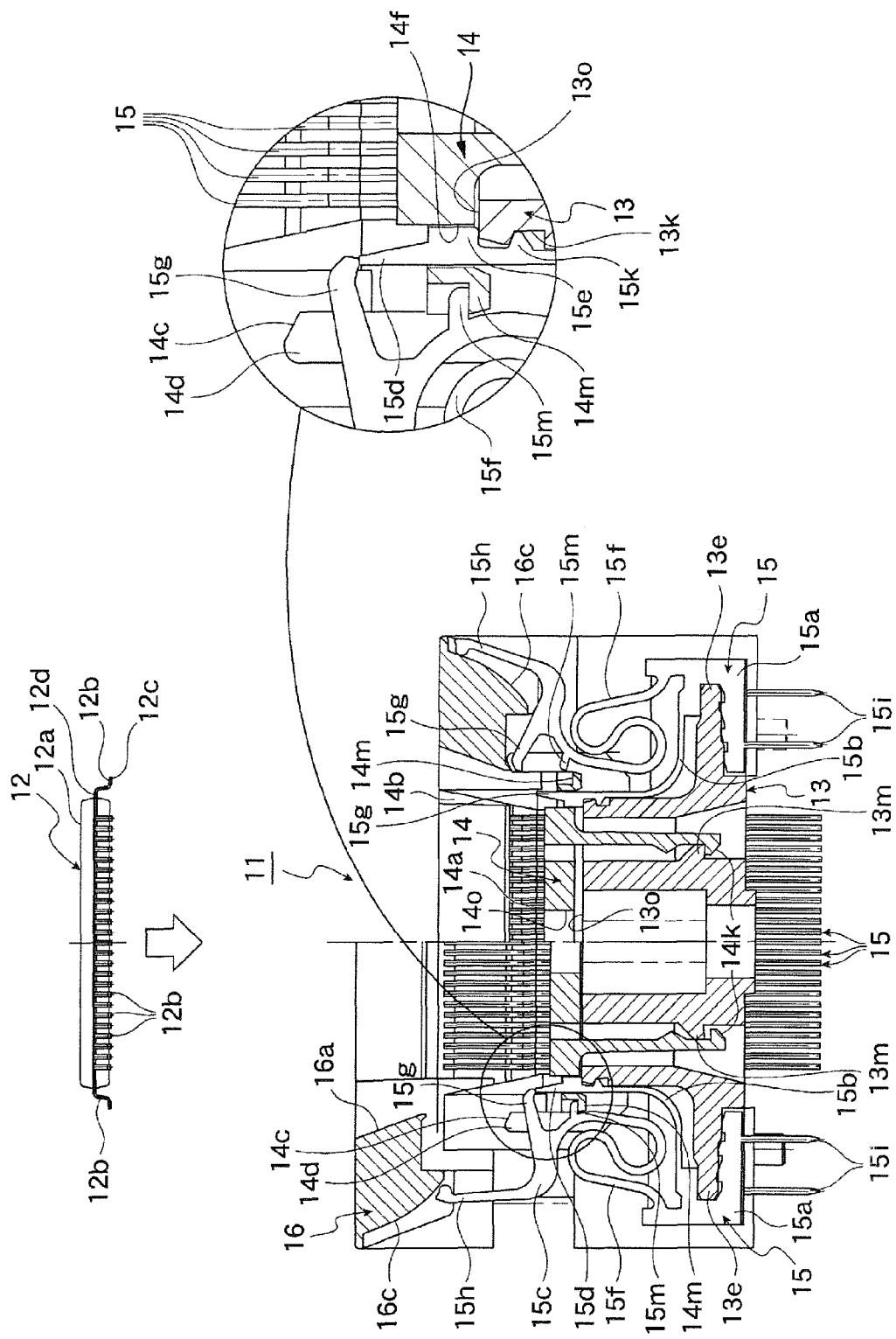
FIG. 2 is an A-A cross-sectional view of FIG. 1, according to embodiment 1.

As shown in the right half of FIG. 2 and others, in floating plate 14, hook pieces 14k to engage with hooked parts 13m of socket body 13, are formed in highest positions. Each hook piece 14 engages with hooked part 13m, so that the rise of floating plate 14 is controlled. Floating plate 14 does down and contacts upper surface 13o of socket body 13, so that the lowest position of floating plate 14 is controlled.

Furthermore, a plurality of contact pins 15 that contact and separate from IC leads 12b and that are elastically deformable, are provided in IC socket body 13, and operating member 16 formed in the shape of a square frame is provided to be able to move up and down and make contact pins 15 deform elastically.

The contact pins 15 are elastic and are made from materials of excellent of electrical conductivity, and, as shown in FIG. 2 and others, press-fit and provided in positions on the outer of accommodating part 14a of floating plate 14.

To be more specific, in a lower portion of each contact pin 15, fixed part 15a to be fixed to socket body 13 is formed. Fixed part 15a is press-fit and fixed in press-fit part 13e of socket body 13 from the side. Fixed contact piece 15b and movable contact piece 15c are provided to project upward from fixed part 15a. These fixed contact piece 15b and movable contact piece 15c form a pair.

In an upper end portion of each fixed contact piece 15b, fixed contact part 15d to contact the lower surface of IC lead 12b is formed. The fixed contact part 15d has a virtually a triangular shape, as shown in FIG. 2 and others. Engaging part 15e is inserted in insertion hole 14f formed in floating plate 14 and engages with socket body 13, so that the downward movement of fixed contact part 15d is controlled and fixed contact part 15d is inserted in each slit 14j of limbs 14h. The upper end portion of each fixed contact part 15d sticks out upward, a little beyond the upper end portion of limbs 14h at the lowest position of floating plate 14. Shoulder part 12d of each IC lead 12b is placed in contact with a narrow-width upper end portion of fixed contact parts 15d.

Furthermore, as shown in FIG. 2 and others, engaging projection 15k is formed nearby below fixed contact part 15d of each fixed contact piece 15b. The engaging projection 15k engages with engaging convex part 13k formed in socket body 13, so that the upward movement of each fixed contact part 15d is controlled.

Spring part 15f that curves in virtually a shape resembling the letter S is formed in each movable contact piece 15c. Above the spring part 15f, movable contact part 15g is provided to extend toward the center portion of floating plate 14. The movable contact part 15g contacts the upper surface of shoulder part 12d of IC lead 12b, presses this downward, and sandwiches shoulder part 12d of IC lead 12b with fixed contact part 15d of fixed contact piece 15b.

Furthermore, in the contact pin 15, operating piece 15h to be pressed by operating member 16 (described later) is formed to extend upward as a separate branch from movable contact part 15g. Below fixed part 15a, lead part 15i to be connected to the wiring board (not shown) extends downward.

Furthermore, in the movable contact piece 15c, as shown in FIG. 2 and others, pressing projecting piece 15m, which serves as a "pressing part," is formed to project toward floating plate 14, below movable contact part 15g, on one end portion of spring part 15f.

Furthermore, in the floating plate 14, pressed part 14m to be pressed by pressing projecting pieces 15m is formed as shown in FIG. 2 and others.

Figure 5:
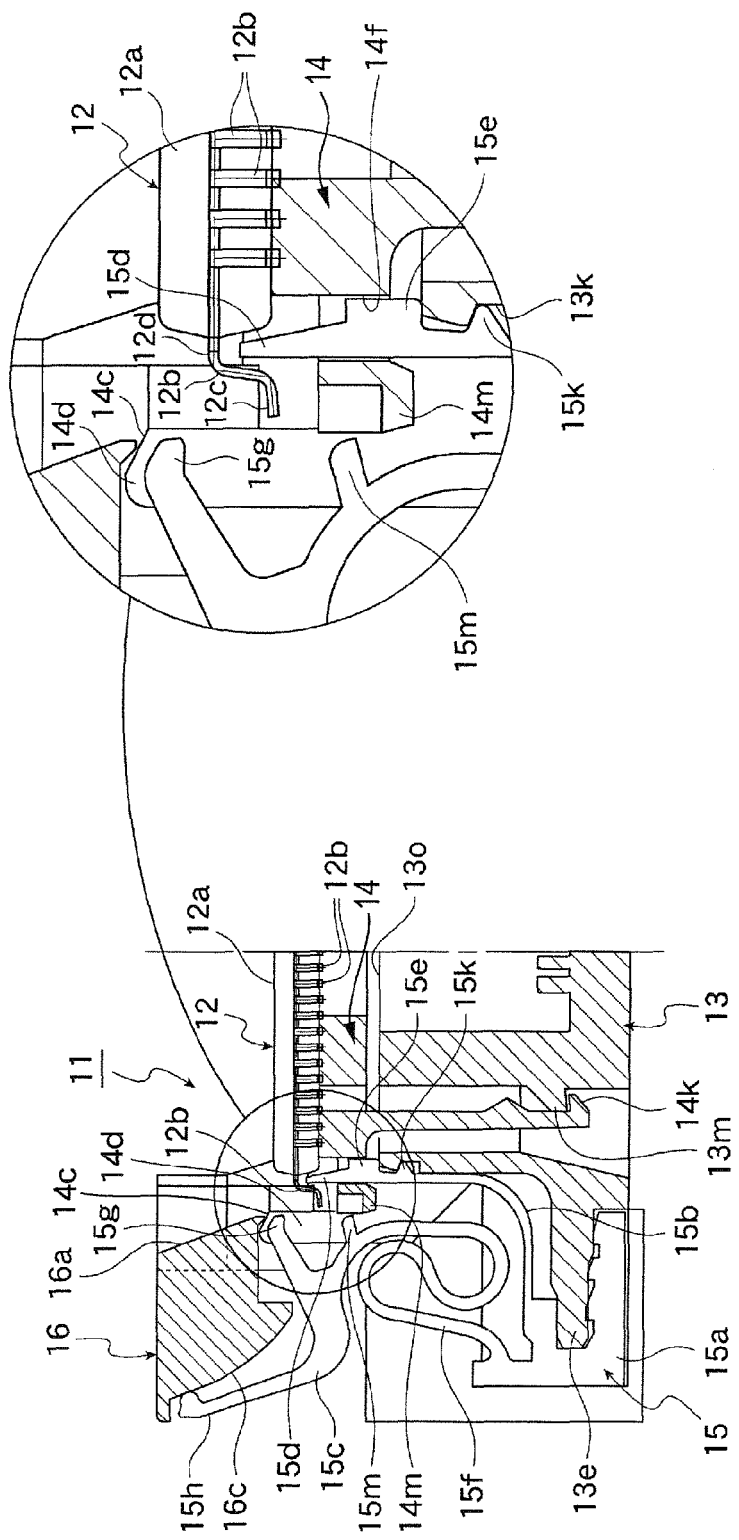
FIG. 5 is a cross-sectional view showing an IC package accommodating state in an IC socket according to embodiment 1, where an operating member has gone down to the lowest position.

Then, when the movable contact piece 15c is elastically deformed in an opening direction and movable contact part 15g is separated from IC lead 12b of IC package 12, as shown in FIG. 5, floating plate 14 rises upward by means of coil springs 18m and IC leads 12b of IC package 12 are separated from fixed contact part 15d.

Figure 8:
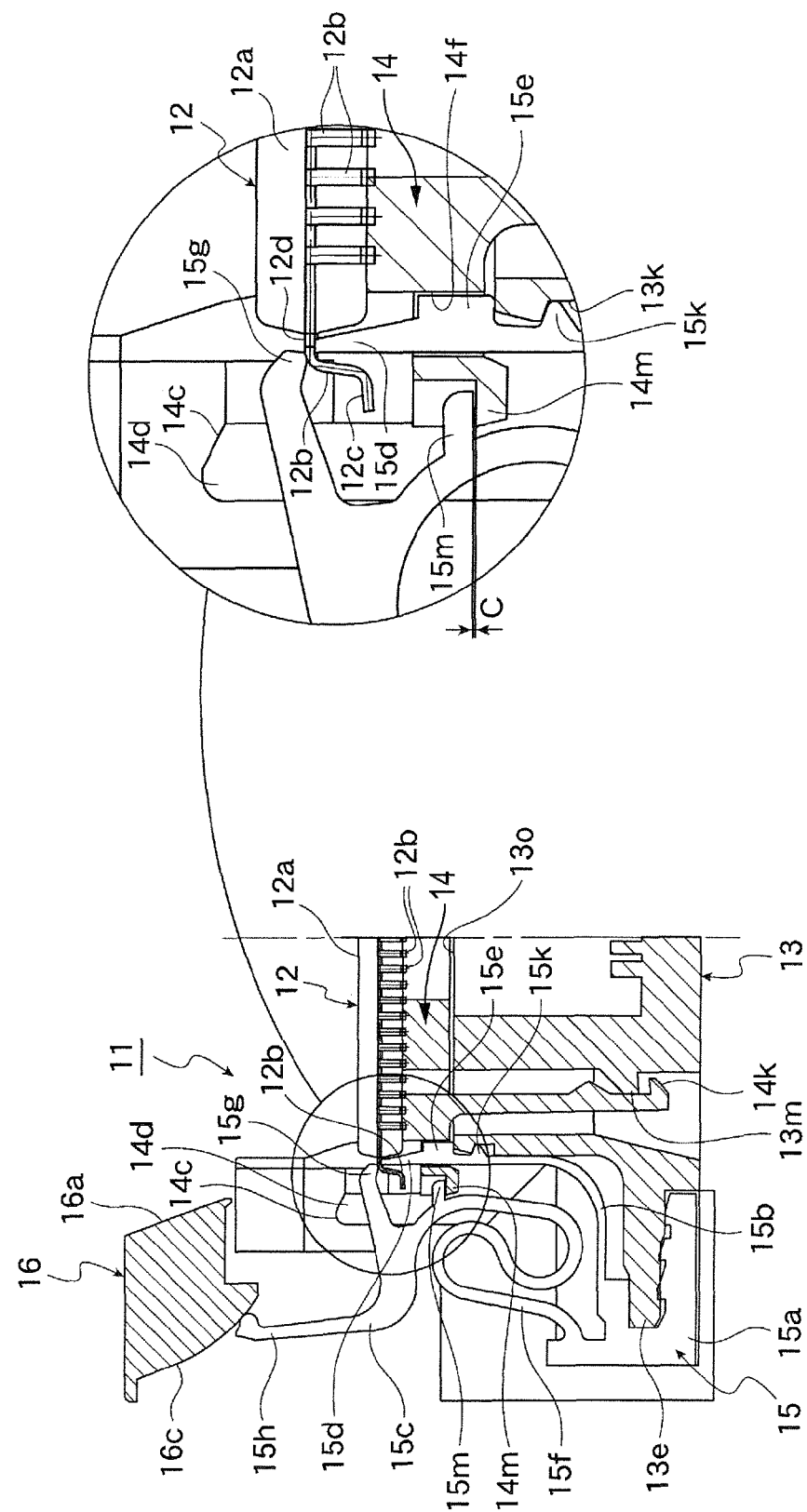
FIG. 8 provides cross-sectional views of an IC socket according to embodiment 1, where (a) is an cross-sectional view showing an IC packet accommodating state and a state in which an operating member has risen to a middle position and (b) is an enlarged view of the X part in (a)

When movable contact piece 15c is displaced in a closing direction by means of elasticity, as shown in FIG. 8, pressing projecting pieces 15m presses against pressed part 14m, so that floating plate 14 goes down against the bias of coil springs 18, fixed contact potion 15d contacts the lower surface of shoulder part 12d of IC lead 12b of IC package 12, and movable contact part 15g contacts the upper surface of shoulder part 12d of IC lead 12b of IC package 12.

To be more specific, when movable contact piece 15c is displaced in a closing direction by means of elasticity, pressing projecting piece 15m presses against pressed part 14m, so that floating plate 14 goes down against the bias of coil springs 18. After movable contact part 15g contacts the upper surface of shoulder part 12d of IC lead 12b of IC package 12, the movable contact part 15g presses against shoulder part 12d of IC lead 12b of IC package 12 and floating plate 14 goes down. By this means, the lower surface of shoulder part 12d of IC lead 12b of IC package 12 contacts fixed contact part 15d, and pressing projecting piece 15m of movable contact piece 15c and pressed part 14m of floating plate 14 are separated, that is, create gap c (see FIG. 8).

Figure 3:
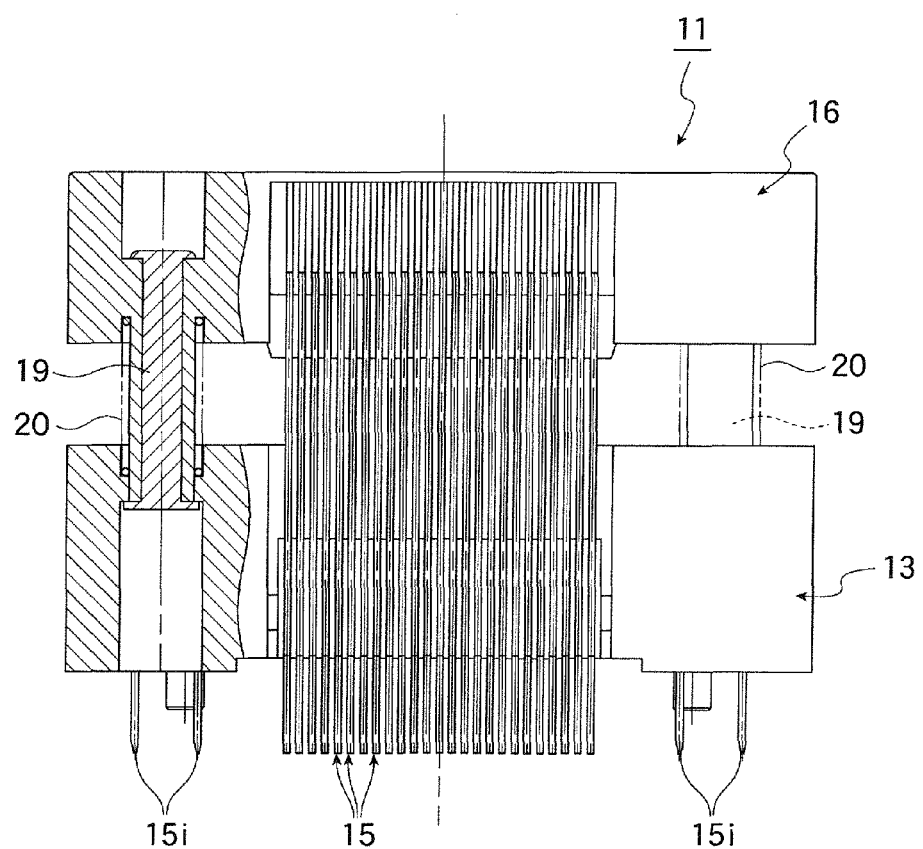
FIG. 3 is a B-B cross-sectional view of FIG. 1, according to embodiment 1.

Meanwhile, operating member 16 has a square frame shape, to match the shape of IC package 12, and has opening 16a of a size IC package 12 can be inserted. IC package 12 is inserted in operating member 16 via the opening 16a, and is accommodated above accommodating part 14a. As shown in FIG. 3, the operating member 16 is provided to be able to move up and down via rivet 19, and biased upward by coil spring 20. Furthermore, the highest position of operating member 16 is controlled by means of rivet 19, so that operating member 16 is prevented from falling.

Furthermore, in the operating member 16, cam part 16c that contacts and slides on operating piece 15h of contact pin 15 is formed. By making the operating member 16 go down, operating piece 15h of the contact pin 15 is pressed against cam section 16c. By this means, spring part 15f is elastically deformed, and movable contact part 15g is displaced outward upwardly at an angle.

Next, the method of using IC socket 11 of the configuration will be explained.

First, lead part 15i of contact pin 15 of IC socket 11 is inserted in an insertion hole on a wiring board and soldered, thereby providing a plurality of IC sockets 11 on a wiring board.

Then, in the IC socket 11, IC package 12 is electrically connected by means of, for example, an automatic device.

That is, an automatic device (not shown) carries IC package 12, and provides a state in which IC package 12 is held in a position above accommodating part 14a of floating plate 14 at the highest position. Then, the automatic device makes operating member 16 go down against the bias of contact pins 15 and the bias of coil springs 20. Then, cam part 16c of operating member 16 presses against contact pin operating piece 15h, spring part 15f is deformed elastically and opens maximally, and movable contact part 15g is displaced upward at angle and leaves an IC package 12 insertion range.

When in this state the automatic device opens IC package 12, IC package 12 is guided by guide part 14b on accommodating part 14a of floating plate 14. In this state, shoulder part 12d of IC lead 12b of IC package 12 is separated on fixed contact part 15d of contact pin 15 (see FIG. 5).

Next, the automatic device cancels the pressing force against operating member 16, operating member 16 rises upward by the elasticity of spring part 15f of movable contact piece 15c of contact pin 15 and coil springs 20, and movable contact part 15g of contact pin 15 starts returning by the elasticity of spring part 15f. Then, when operating member 16 has risen to a predetermined position, pressing projecting piece 15m of movable contact piece 15c contacts pressed part 14m of floating plate 14 (see FIG. 6). Then, when operating member 16 rises upward and movable contact piece 15c is displaced in a closing direction by means of elasticity, pressing projecting piece 15m is pressed against pressed part 14m, so that floating plate 14 goes down against the bias of coil springs 18, fixed contact part 15d contacts the lower surface of shoulder part 12d of IC lead 12b of IC package 12, and movable contact part 15g contacts the upper surface of shoulder part 12d of IC lead 12b of IC package 12 (see FIG. 7).

To be more specific, when movable contact piece 15c is displaced in a closing direction by means of elasticity, pressing projecting piece 15m is against pressed part 14m, so that floating plate 14 goes down against coil springs 18. Then, after movable contact part 15g contacts the upper surface of shoulder part 12d of IC lead 12b of IC package 12, the movable contact part 15g is pressed against shoulder part 12d of IC lead 12b of IC package 12, floating plate 14 goes down, the lower surface of shoulder part 12d of IC lead 12b of IC package 12 contacts fixed contact part 15d, pressing projecting piece 15m of movable contact piece 15c and pressed part 14m of floating plate 14 are separated, that is, create gap c (see FIG. 8). By means of the separation, the elasticity of spring part 15f of movable contact piece 15c does not work as a force to push floating plate 14 upward but works as a force by which movable contact part 15g contacts IC lead 12g, so that the contact pressure of movable contact part 15g and IC lead 12b is secured.

Figure 9:
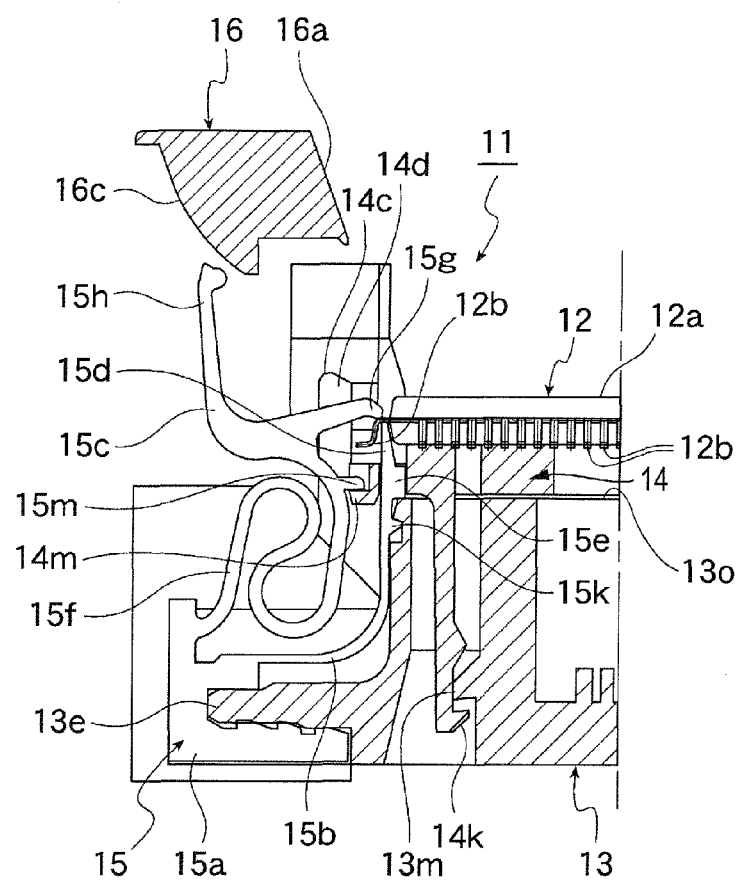
FIG. 9 is a cross-sectional view showing an IC package accommodating state in an IC socket according to embodiment 1, where an operating member has risen to the highest position.

Then, as shown in FIG. 9, operating member 16 rises upward completely, and movable contact part 15g and fixed contact part 15d of contact pin 1 contact the upper and lower surfaces of shoulder part 12d of predetermined IC lead 12b of IC package 12 having been positioned, and establish an electrical connection.

In this state, a burn-in test of IC package 12 is conducted.

Figure 6:
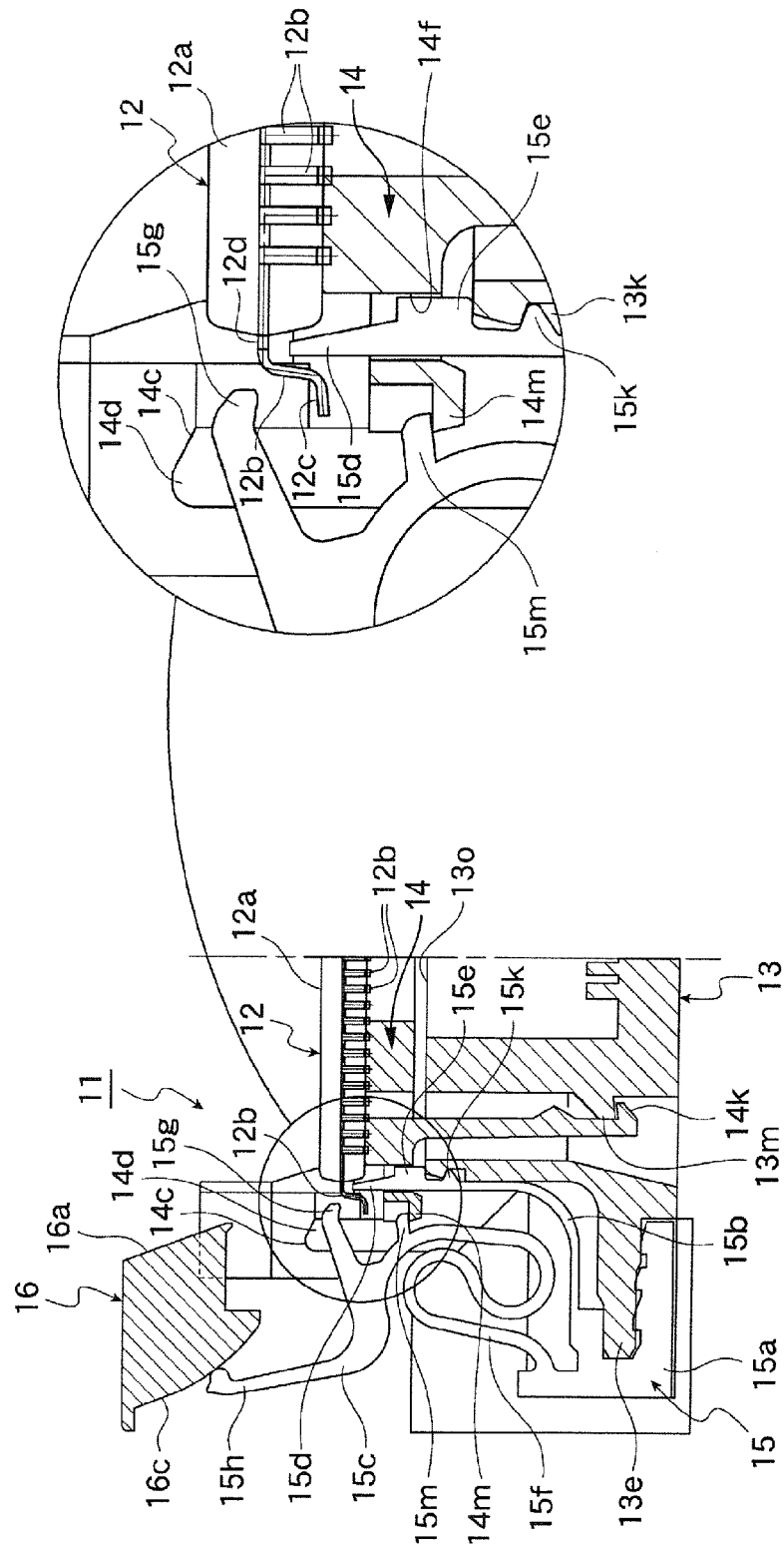
FIG. 6 is a cross-sectional view showing an IC package accommodating state in an IC socket, where an operating member has risen to a middle position.
Figure 7:
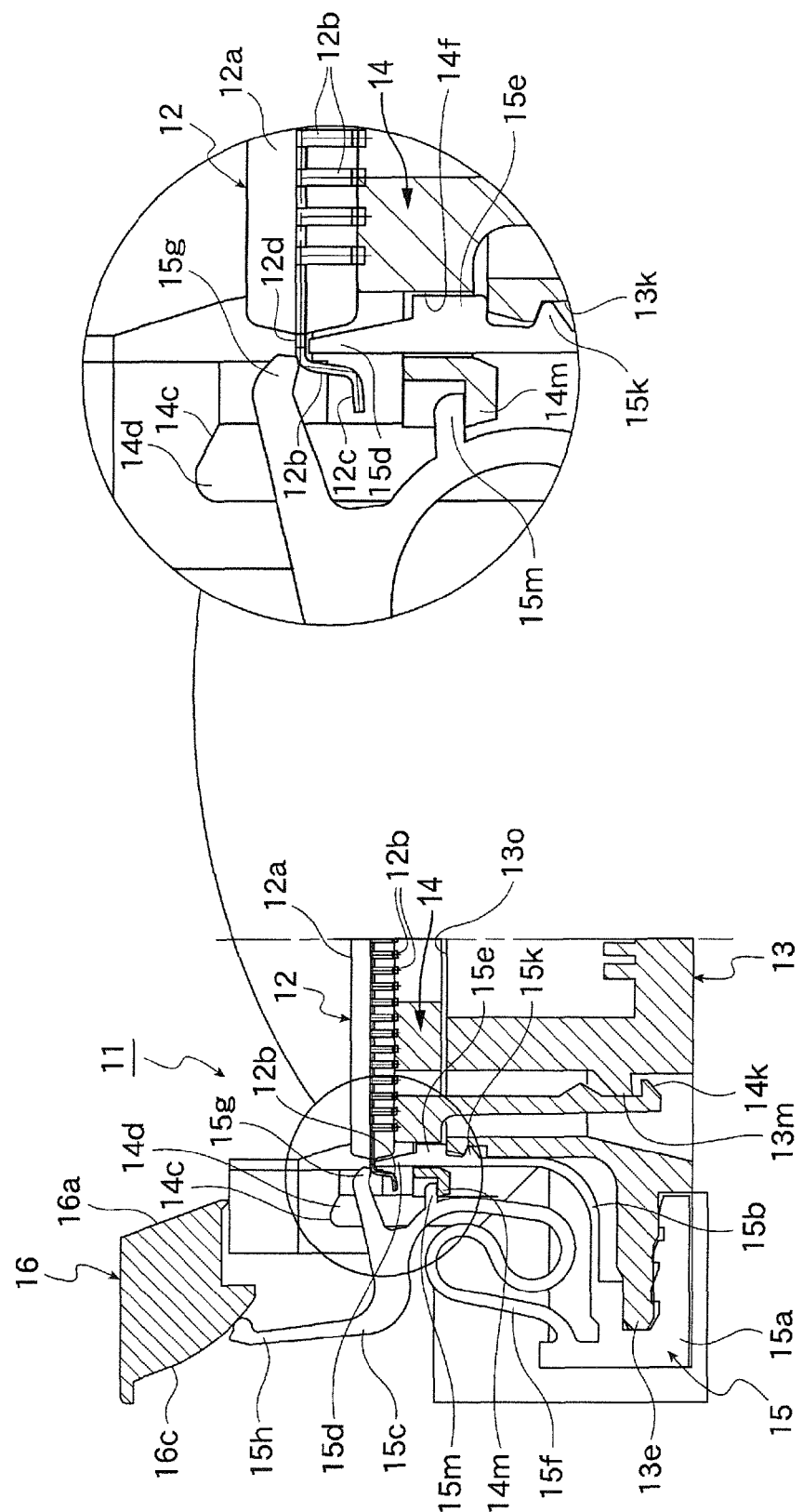
FIG. 7 is a cross-sectional view showing an IC package accommodation state in an IC socket, where an operating member has risen to a middle position.

Then upon removing IC package 12 after a burn-in test is finished, as shown in FIG. 9, operating member 16 goes down. Then, cam part 16c of operating member 16 biases movable contact piece 15c is an opening direction, and, from the state shown in FIG. 7 and FIG. 8 to the state shown in FIG. 6, pressing projecting piece 15m of movable contact piece 15c is displaced upward as shown in FIG. 6. By this means, floating plate 14 rises upward by means of the bias of coil spring 18.

By this means, IC package 12 is lifted, and IC lead 12b separates from fixed contact part 15d, so that adhesion known heretofore is prevented. At the same time, movable contact part 15g also separates from IC lead 12b. Then, as shown in FIG. 5, when operating member 16 has gone to the lowest position, movable contact part 15g leaves the IC package 12 removal range, and IC package 12 can be removed.

Thus, by lifting up IC package 12 by means of floating plate 14, it is possible to solve the problem that fixed contact part 15g having a narrow upper end portion bites into shoulder part 12d of IC lead 12b and does not separate from shoulder part 12d of IC lead 12b.

Then, when movable contact piece 15c is displaced in a closing direction by means of elasticity, pressing projecting piece 15m of movable contact piece 15c is pressed against pressed part 14m of floating plate 14, so that floating plate 14 goes down against the bias of coil springs 18 and movable contact part 15g contacts the upper surface of IC lead 12b. By this means, the closing speed of movable contact piece 15c is slowed down when pressing projecting piece 15m contacts pressed part 14m, and, given that movable contact part 15g later contacts the upper surface of IC lead 12b, it is possible to provide a damping effect or cushion the impact upon the contact.

(Embodiment 2)

FIG. 11 through FIG. 15 show an IC socket and IC package according to embodiment 2 of the present invention.

Although coil springs 18 have been used as "biasing member" to bias floating plate 14 with embodiment 1, with the embodiment 2 now, ground pin 22 is used instead of coil springs 18.

The ground pin 22 is made from an elastic metal material. Fixed part 22a of ground pin 22 is fixed in socket body 13. From the fixed part 22a, lead part 22b extends downward. The lead part 22b is electrically connected with a wiring board (not shown).

Furthermore, in ground pin 22, spring part 22c that curves above fixed part 22a is formed. From the upper end portion of the spring part 22c, elastic biasing piece part 22d and ground contact part 22e are formed in two directions. The elastic biasing piece part 22d contacts the lower surface of floating plate 14 and biases floating plate 14 upward. Ground contact part 22e sticks out upward from opening 14o in floating plate 14, and contacts the lower surface of package body 12a.

Next, the method of using IC socket 11 of the configuration will be explained.

Figure 11:
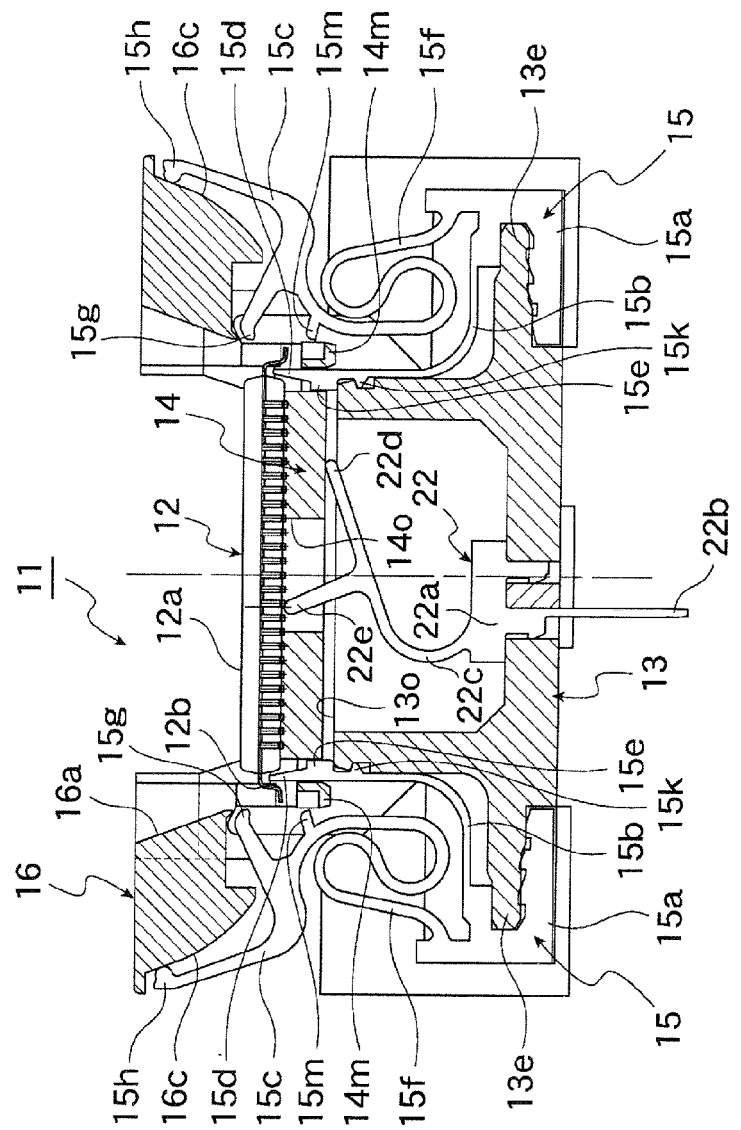
FIG. 11 is a cross-sectional view showing an IC package accommodating state in an IC socket according to embodiment 2 of the present invention, where an operating member has gone down to the lowest position.

First, as shown in FIG. 11, in a state in which operating member 16 is at the lowest position and movable contact piece 15c is elastically deformed and open, floating plate 14 is at the highest position by means of the bias of elastic biasing piece part 22d.

Figure 12:
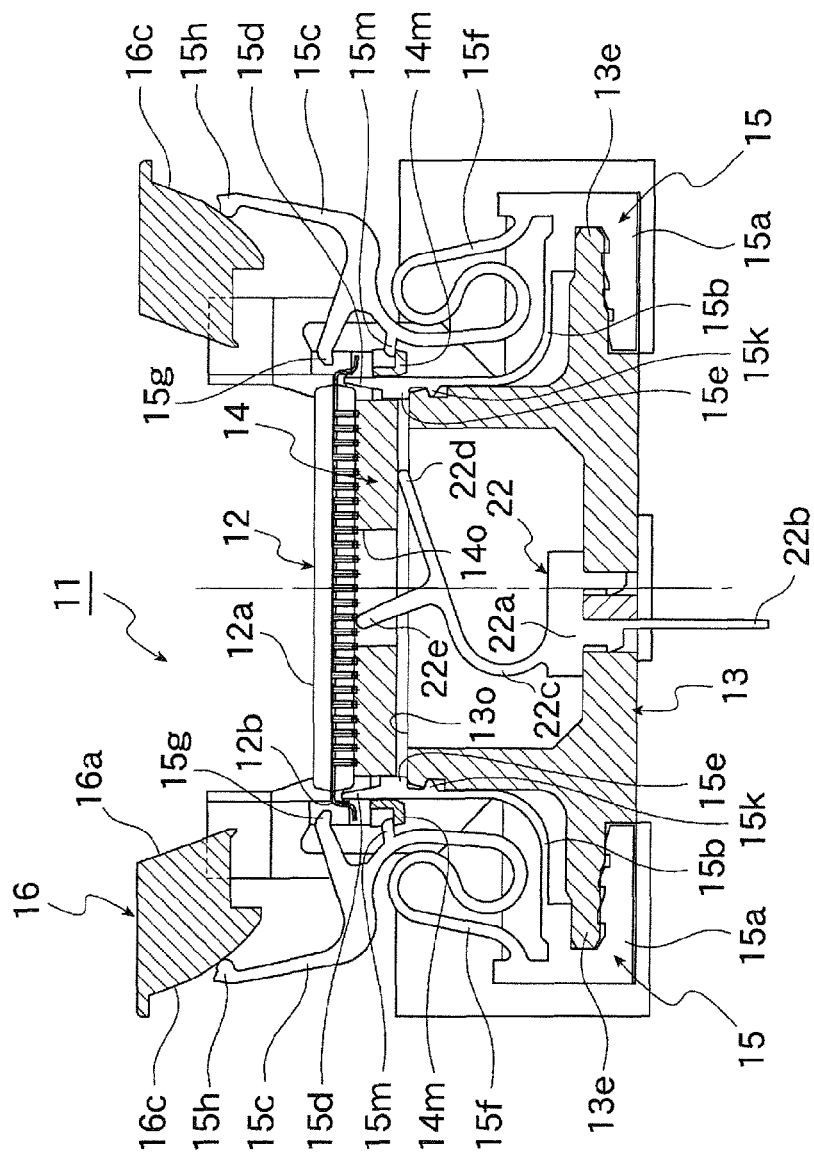
FIG. 12 is a cross-sectional view showing an IC package accommodating state in an IC socket according to embodiment 2, where an operating member has risen to a middle position.

From this state, by starting canceling the bias of operating member gradually, the operating member 16 rises and movable contact piece 15c closes, and pressing projecting piece 15m contacts pressed part 14m of floating plate 14 (see FIG. 12).

Figure 13:
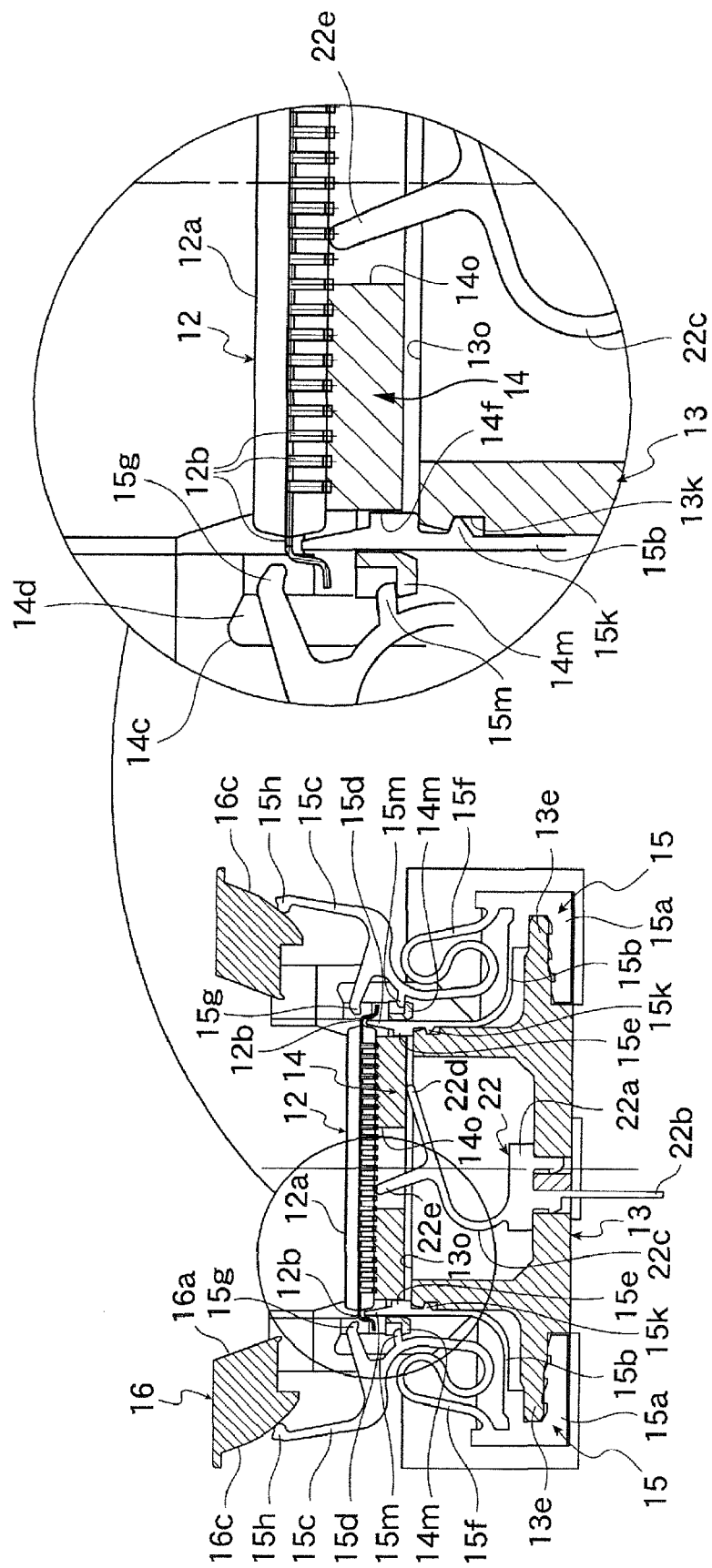
FIG. 13 is a cross-sectional view showing an IC package accommodating state in an IC socket according to embodiment 2, where an operating member has risen to a middle position.

Furthermore, when operating member 16 rises upward and movable contact piece 15c starts closing, floating plate 14 goes down by means of pressing projecting piece 15 (see FIG. 13).

Figure 14:
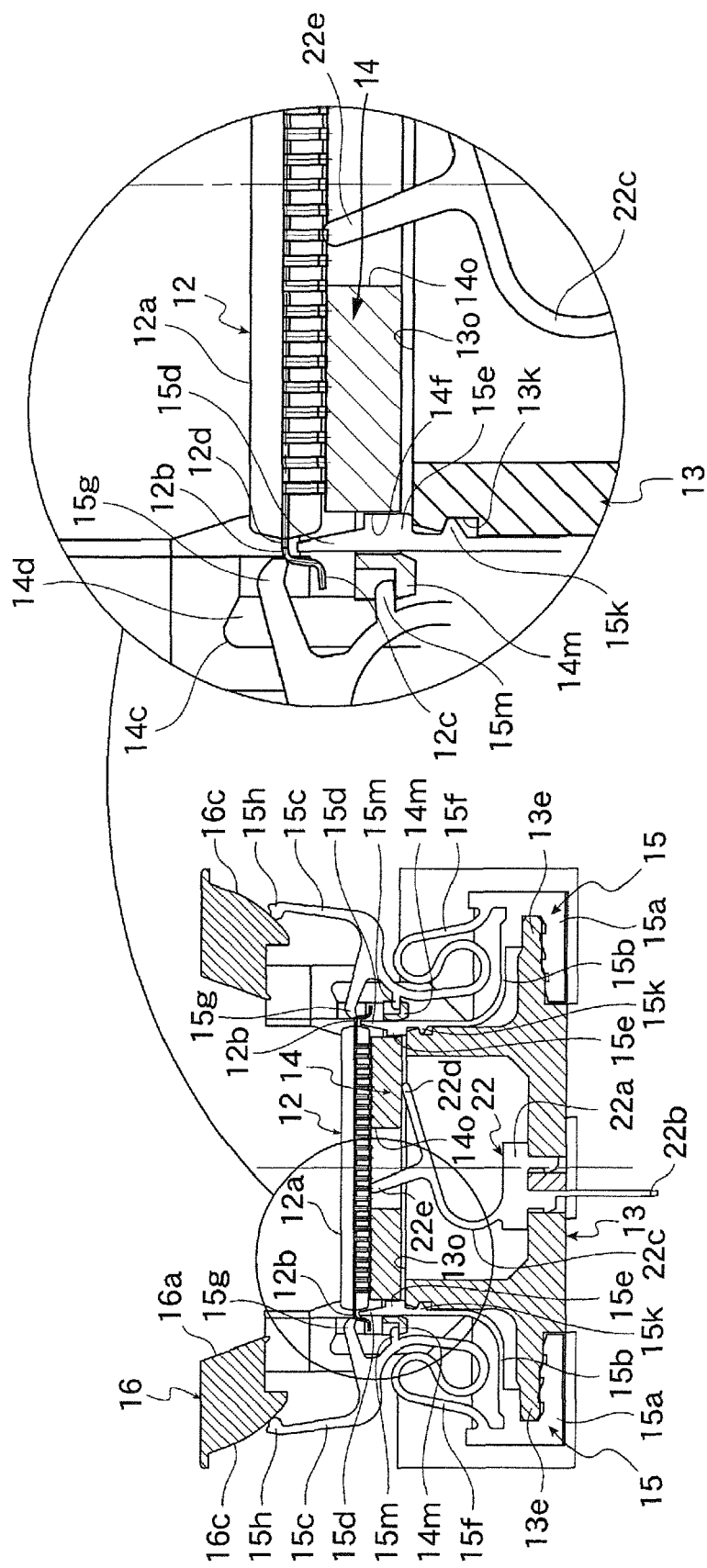
FIG. 14 is a cross-sectional view showing an IC package accommodating state in an IC socket according to embodiment 2, where an operating member has risen to a middle position.
Figure 15:
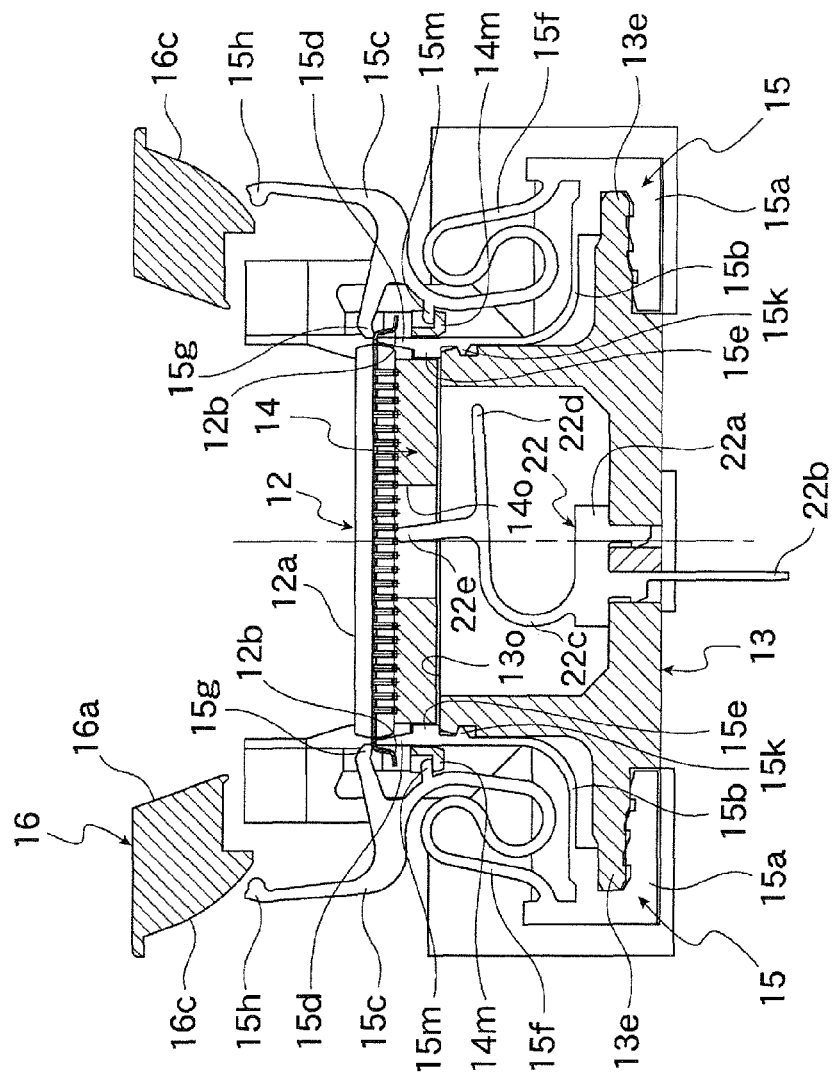
FIG. 15 is a cross-sectional view showing an IC package accommodating state in an IC socket according to embodiment 2, where an operating member has risen to the highest position.

Then, as shown in FIG. 14, if movable contact part 15g of movable contact piece 15c contacts IC lead 12b and from the state movable contact piece 15c starts closing, IC package 12 is pressed by movable contact part 15g and goes down with floating plate 14, the floating plate 14 contacts upper surface 13o of socket body 13, and IC lead 12b contacts fixed contact part 15d.

Ground contact part 22e, thereupon, slides on the lower surface of package body 12a, thereby providing a state in which the ground contact part 223 placed substantially vertical. By this means, elastic biasing piece part 2 becomes nearly lateral and separates from floating plate 14 (see FIG. 15). Consequently, the elasticity of ground pin 22 works as a contact pressure of ground contact part 22e and package body 12a, and also works as a contact pressure of IC lead 12b and fixed contact part 15d. By this means, contact pressure cane be secured.

In this state, a burn-in test of IC package 12 is conducted.

Afterwards, to remove IC package 12, by contrast with the above, by making operating member 16 go down, elastic biasing piece part 22d of ground pin 22 contacts the lower surface of floating plate 14 and lifts the floating plate 14 upward. By this means, fixed contact part 15d separates from IC lead 12b, so that it is possible to prevent the problem that fixed contact part 15d bites into the lower surface of shoulder part 12d of IC lead 12b and does not separate from shoulder part 12d of IC lead 12b, and therefore remove IC package 12 easily.

The rest of the configurations and effects are the same as with embodiment 1 and will not be explained.

Although with the above embodiments the present invention has been applied to IC socket 11 as an "electrical component socket," the present invention is not limited to this and is equally applicable to other apparatuses as well. Although cases have been described with the above embodiments where the present invention is applied to IC package 12 in which IC leads 12b stick out from four sides of package body 12a, the present invention is not limited to this and is equally applicable to an IC package in which IC leads stick out sideways from two opposing sides of an IC package body Although cases have been described above with the above embodiments where limbs 14h are formed in floating plate 14, the present invention is not limited to this, and it is equally possible to form limbs 14h in socket body 13 or remove them.

Industrial Applicability

The electrical component socket according to the present invention can be used for a performance test of an electrical component such as an IC package.

REFERENCE SIGNS LIST

11 IC socket (electrical component socket)
12 IC package (electrical component)
12a package body (electrical component body)
12b IC lead (terminal)
13 socket body
14 floating plate
14a accommodating part 14b guide part
14c partition part
14h limb
14m pressed part
15 contact pin
15b fixed contact piece
15c movable contact piece
15d fixed contact part
15f spring part
15g movable contact part
15h operating piece
15m pressing projecting piece (pressing part)
16 operating member
22 ground pin
22a fixing part
22b lead part
22c spring part
22d elastic biasing piece part
22e ground contact part

The invention claimed is:

1. A socket for an electrical component having a terminal extending sideways, comprising:
    a socket body for accommodating the electrical component; and
    a contact pin attached to the socket body, said contact pin including a movable contact piece capable of elastically deforming, said movable contact piece including a movable contact part for contacting with and separating from an upper surface of the terminal of the electrical component and a fixed contact piece paired with the movable contact piece at an end portion thereof, said fixed contact piece including a fixed contact part for contacting with a lower surface of the terminal of the electrical component,
    wherein said socket body includes a floating plate arranged to be movable upward and downward for accommodating the electrical component, and a biasing member for urging the floating plate upward;
    said floating plate includes a pressed part;
    said movable contact piece includes a pressing part for pressing the pressed part;
    said biasing member lifts the floating plate rises upward when the movable contact piece is elastically deformed in an opening direction so that the movable contact part separates from the terminal and the terminal separates from the fixed contact part; and
    said pressing part presses the pressed part to move the floating plate downward against an urging force of the biasing member when the movable contact piece moves in a closing direction through elasticity thereof so that the movable contact part contacts with the upper surface of the terminal and the fixed contact part contacts with the lower surface of the terminal.

2. The socket for the electrical component according to claim 1, wherein said movable contact part is arranged to press the terminal, and the pressing part is separated from the pressed part after the movable contact part contacts with the upper surface of the terminal when the movable contact piece moves in the closing direction.

3. The socket for the electrical component according to claim 1, wherein said biasing member includes a ground pin formed of an elastic metal material, said ground pin including an elastic biasing piece part for contacting the lower surface of the floating plate and urging the floating plate upward, and a ground contact part protruding upward from an opening of the floating plate for contacting with the lower surface of the electrical component, said elastic biasing contact piece part being arranged to separate from the floating plate when the floating plate moves downward against the urging force of the biasing member and the ground contact part contacts with the lower surface of the electrical component.

4. The socket for the electrical component according to claim 1, wherein said electrical component includes the terminal formed in a shape of a crank, said terminal having a shoulder part formed higher than the end portion of the terminal for contacting with the movable contact part at an upper surface thereof and contacting with the fixed contact part at a lower surface thereof.

* * * * *